United States Patent [19]
Ikeda et al.

[11] Patent Number: 6,052,301
[45] Date of Patent: Apr. 18, 2000

[54] SEMICONDUCTOR MEMORY DEVICE

[75] Inventors: Toshimi Ikeda; Kuninori Kawabata; Masato Takita, all of Kawasaki, Japan

[73] Assignee: Fujitsu Limited, Kawasaki, Japan

[21] Appl. No.: 09/272,296

[22] Filed: Mar. 19, 1999

[30] Foreign Application Priority Data

Jun. 30, 1998 [JP] Japan .................................. 10-185045

[51] Int. Cl.[7] .................................................. G11C 5/06
[52] U.S. Cl. .......................... 365/63; 365/52; 365/230.06
[58] Field of Search .......................... 365/63, 52, 230.06, 365/214

[56] References Cited

U.S. PATENT DOCUMENTS

| | | | |
|---|---|---|---|
| 4,779,227 | 10/1988 | Kurafuji et al. | 365/63 |
| 5,449,934 | 9/1995 | Shono et al. | 257/295 |
| 5,572,480 | 11/1996 | Ikeda et al. | 365/230.06 |
| 5,875,149 | 2/1999 | Oh et al. | 365/230.06 |
| 5,996,340 | 10/1999 | Fujini et al. | 365/230.03 |

FOREIGN PATENT DOCUMENTS

60-57647  4/1985  Japan .
4-345052 12/1992  Japan .

*Primary Examiner*—David Nelms
*Assistant Examiner*—Gene Auduong
*Attorney, Agent, or Firm*—Arent Fox Kintner Plotkin & Kahn, PLLC

[57] ABSTRACT

According to the present invention, the main word lines arranged in a row direction have a linear pattern shape, and in the region where sub word decoder circuits are formed, the pattern of the main word lines has a shape whereby the pattern branches and splits into a plurality of lines and then reconverges, in the direction of the row. In the region where the line splits, relatively small island-shaped patterns of the conducting layer are located, forming nodes which have a difference electric potential from the main word lines. The main word lines are constituted by a first metal conducting layer, similarly to the prior art. In other words, small island-shaped metal layer patterns, which are electrically different from the main word lines are formed inside the conducting metal layer pattern constituting the main word lines, similarly to island formed in the middle of a river, for example.

6 Claims, 8 Drawing Sheets

FIG. 8 COMPARATIVE EXAMPLE A1-I

SEMICONDUCTOR MEMORY DEVICE

BACKGROUND OF THE INVENTION

1. Field of the Invention

The present invention relates to a semiconductor memory device, such as a dynamic RAM (DRAM), or the like, and more particularly, to improvements in the pattern layout of main word lines in a sub word decoder section for supplying main word lines and driving sub word lines.

2. Description of the Related Art

In recent years, semiconductor memory devices, such as DRAMs, have been increasing continually in capacity. In accordance with this, the word lines and bit lines used for selecting memory cells are constituted by low-resistance metal wiring layers, and a hierarchical structure is adopted for the word lines. The most typical composition of a DRAM in recent years is one where the wiring layers formed on a silicon substrate comprise two conducting layers composed of polysilicon and two metal wiring layers composed of aluminium of an alloy thereof. The first metal wiring layer is used for main word lines arranged in rows, and the second metal wiring layer located above this first layer is used for bit lines, column selection signal lines, and the like, arranged perpendicularly to the direction of the rows.

With the use of a hierarchical structure for word lines, there are provided a main word decoder for selecting and driving main word lines, and sub word decoders for selecting and driving sub word lines to which these main word lines are connected and which are in turn connected to memory cells. The main word lines are constituted by the first metal wiring layer and the sub word lines are constituted by the polysilicon conducting layer located therebelow. The main word decoder is located in a position at one end of the memory cell area, whilst the sub word decoders are distributed within the memory cell area.

A sub word decoder selected from the plurality of sub word decoders connected to the selected main word line by means of a separate selection signal drives the sub word line located subordinately thereto. This hierarchical structure avoids the operation of providing a single long word line in a high-capacity memory cell area and driving all of the memory cells on that row by means of the long word line. By adopting a hierarchical structure, a main word line constituted by a first metal wiring layer having a low resistance is driven, the corresponding rows are selected in a short time, and the short sub word lines formed in the underlying polysilicon conducting layer are driven individually, thereby driving the actual memory cells. By driving only the sub word lines belonging to the selected memory cell, it is possible to eliminate unnecessary driving of word lines, which helps to reduce power consumption.

If the foregoing composition is adopted, main word lines constituted by the first metal wiring layer are arranged in rows and sub word decoder circuits are formed such that they overlap with these main word lines. The sub word decoder circuits are formed by using the second of the polysilicon conducting layers, which is more adjacent to the silicon substrate than the first metal wiring layer. Furthermore, the sub word lines are constituted by using the polysilicon conducting layer. The layout efficiency is raised by using these sub word lines as gate electrodes for the memory cell selection transistors.

With the conventional multiple layer wiring structure and the hierarchical structure of word lines described above, it is necessary to lay out the sub word decoder circuits distributed within the memory cell area in a compact fashion. Since it is necessary to form a large number of sub word decoder circuits when a hierarchical word line structure is adopted, optimizing the layout of the respective sub word decoder circuits and minimizing the surface area thereof means being able to broaden the memory cell area, accordingly.

However, by forming the first metal wiring layer constituting the main word lines as a layer above the sub word decoder circuits, a trade off is generated between compactification of the sub word decoder circuits and reduction in the resistance of the first metal wiring layer constituting the main word lines. In other words, desirably, the main word lines constituted by the first metal conducting layer should be located at a small pitch corresponding to the pitch of the memory cells, whilst at the same time their resistance is reduced by forming the lines to a large width. On the other hand, it is also desirable for the sub word decoder circuits to be reduced in size. However, it is necessary to use a portion of the first metal conducting layer constituting the main word lines for the composition of the sub word decoder circuits, in the sub word decoder region. For example, in order to connect the polysilicon conducting layer with a region in the silicon substrate which contains an impurity of a different conductor type, it is not possible to connect the polysilicon conducting layer directly to the silicon substrate, but rather it is necessary first to connect the first metal conducting layer to the silicon substrate, and then to connect the polysilicon conducting layer thereto via the metal conducting layer. Alternatively, in order to connect the silicon substrate to the second metal conducting layer forming the bit lines, which occupies a position further above the substrate, the silicon substrate is first connected to the first metal conducting layer, which occupies a lower position, and then this lower first metal conducting layer is connected to the upper second metal conducting layer.

In this way, when forming the sub word decoder circuits, it is not possible to use all of the lower-positioned first metal conducting layer in this region for the main word lines, and in a portion of this region, it is necessary to provide patterns in the first metal conducting layer which form nodes having a different electric potential from the main word lines. The presence of these patterns in a portion of the metal conducting layer has some effect on the line width and linearity of the main word lines passing through this region. Depending on the layout, the pattern of the main word lines in the sub word decoder region may take a shape that is severely contorted, rather than a linear shape. Furthermore, due to the presence of the patterns in a portion of the metal conducting layer, a situation arises where the line width of the pattern of the main word lines cannot be further reduced.

Main word lines having a pattern shape of this kind cause resistance to increase, and lead to corruption or delaying of the signal waveform carried thereby. Delay or waveform corruption in the main word lines is not desirable in a hierarchical word line structure. This is because if the main word lines themselves has a low resistance, and they cannot be driven in a short period of time, then the merits of structuring the word lines hierarchically is lost. Moreover, if a portion of the main word lines becomes narrow, then this may lead to the occurrence of electromigration. Moreover, if a contorted pattern shape is adopted, it becomes necessary to increase the size of the sub word decoder region itself.

SUMMARY OF THE INVENTION

Therefore, it is an object of the present invention to provide a semiconductor memory device, whereby sub word decoder circuits can be formed in a smaller region and the pattern of main word lines located over this region of the sub word decoder circuits can be formed to a linear shape, as far as possible.

It is a further object of the present invention to provide a semiconductor memory device having a novel pattern shape for main word lines, whereby increase in the resistance of the main word lines can be prevented, and the sub word decoder circuits can be incorporated into a smaller region.

In order to achieve the aforementioned objects, in the present invention, the main word lines arranged in a row direction have a linear pattern shape, and in the region where sub word decoder circuits are formed, the pattern of the main word lines has a shape whereby the pattern branches and splits into a plurality of lines and then reconverges, in the direction of the row. In the region where the line splits, relatively small island-shaped patterns of the conducting layer are located, forming nodes which have a difference electric potential from the main word lines. The main word lines are constituted by a first metal conducting layer, similarly to the prior art. In other words, small island-shaped metal layer patterns, which are electrically different from the main word lines are formed inside the conducting metal layer pattern constituting the main word lines, similarly to island formed in the middle of a river, for example.

A main word line pattern of this kind allows the presence of other small patterns located in the direction of the wiring, without impairing the linearity of the main word lines. Moreover, the pattern for the main word lines does not have a severely contorted shape in order to avoid these small patterns, but rather it has a shape whereby the pattern splits on either side of the small pattern and then reconverges thereafter. Consequently, it is possible to prevent reduction in the resistance of the main word lines, or electromigration, in this region.

In order to achieve the aforementioned objects, the present invention is a semiconductor memory device having a plurality of memory cells and a plurality of conducting layers formed on a semiconductor substrate, comprising: a plurality of main word lines composed of a first conducting layer formed on the semiconductor substrate and arranged in a row direction in the region of the memory cells; a plurality of sub word lines composed of a second conducting layer positioned below the first conducting layer formed on the semiconductor substrate; and sub word decoder circuits for driving the sub word lines, positioned along the path of the main word lines; wherein, in the region in which the sub word decoder circuits are formed, the pattern of the main word lines has a shape whereby the pattern temporarily branches and splits into a plurality of lines and then reconverges, along the row direction, island-shaped patterns which are electrically different from the main word lines being formed within the split region by means of the first conducting layer.

By adopting this composition, even of the pattern of the main word lines extending in a row direction encounters island-shaped patterns which are electrically different thereto, in the region in which the sub word decoder circuits are formed, by adopting a shape whereby the pattern branches temporarily and splits into a plurality of lines and then reconverges, it is possible to preserve a shape which extends in a linear fashion, without coming into contact with the island-shaped patterns, and hence it is possible to prevent an increase in resistance of the main word line in this region.

Furthermore, in order to achieve the aforementioned objects, the present invention is a semiconductor memory device having a plurality of memory cells and a plurality of conducting layers formed on a semiconductor substrate, comprising: a plurality of word lines composed of a conducting layer formed on the semiconductor substrate and arranged in a prescribed direction within the region of the memory cells, wherein the pattern of the word lines has a shape whereby the pattern branches temporarily and splits into a plurality of lines and then reconverges, along the prescribed direction, island-shaped patterns, which are electrically different from the word lines, being formed within the separated regions by means of the conducting layers.

By adopting this composition, it is possible to form electrically different island-shaped patterns inside the word line pattern, without impairing the pattern width of the word lines required for high-speed driving.

DESCRIPTION OF THE PREFERRED EMBODIMENTS

Below, an embodiment of the present invention is described with reference to the drawings. However, the technical scope of the present invention is not limited to this embodiment.

Figure 1:
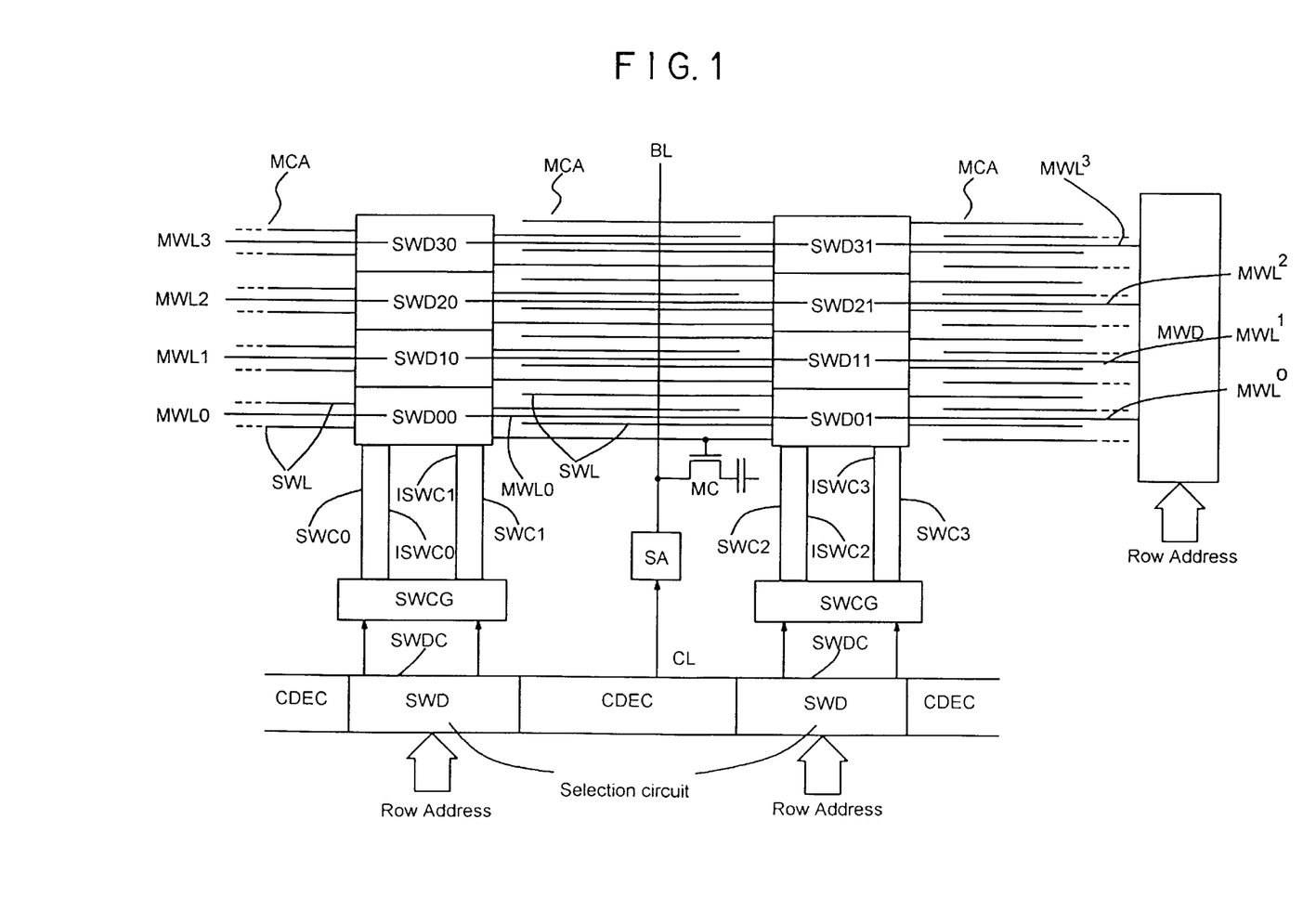
FIG. 1 is an approximate compositional diagram of a semiconductor memory device according to an embodiment of the present invention.

FIG. 1 is an approximate compositional diagram of a semiconductor memory device according to the present embodiment. In the diagram, a main word decoder MWD is located on the right-hand edge, and a memory cell area MCA where a plurality of memory cells MC are positioned is located to the left thereof. The main word decoder MWD selects and drives one of a plurality of main word lines MWL0–MWL3. The main word lines MWL are arranged in rows inside the memory cell area MCA. Furthermore, a plurality of sub word decoders SWD00–SWD31 are arranged in the memory cell area MCA, along the path of the main word lines MWL. Although omitted from FIG. 1, the main word lines MWL are arranged such that they pass over the respective sub word decoders SWD.

A main word line MWL and a pair of selection signals SWC, /SWC are supplied respectively to the sub word decoder SWD. The pair of selection signals SWC, /SWC are supplied by SWC generating circuits SWCG provided between the sensor amp SA columns, in response to selection signals from sub word decoder column selection circuits SWDC provided between each column decoder CDEC column. The pair of selection signals SWC, /SWC are arranged in a column direction and by combining them with a main word line MWL, a sub word decoder SWD is selected and the sub word line SWL connected to that sub word decoder SWD is driven. In the example in FIG. 1, each of the sub word decoders SWD 00–31 has a pair of sub word decoder circuits, which drive one or other of the pair of sub word lines SWL.

The sub word decoders SWD 00–30 and SWD 01–31 arranged in a column fashion drive a pair of sub word lines SWL, respectively, and the pairs of sub word lines SWL leading from both column-shaped sub word decoders are positioned alternately such they interleave with each other.

A plurality of bit lines BL are arranged in a column direction in the memory cell area MCA. In FIG. 1, only one bit line BL is illustrated, for the sake of simplicity. Furthermore, a memory cell MC consisting of a transistor and a capacitor is provided at the intersection point between the bit line BL and the sub word line SWL.

As illustrated in FIG. 1, in order to drive a high-capacity memory cell, the main word decoder MWD selects a main word line MWL, and one of the plurality of sub word decoders SWD arranged in a row fashion belonging to that main word line MWL selects a single sub word line SWL. In other words, a hierarchical structure comprising main word lines and sub word lines is adopted.

Figure 2:
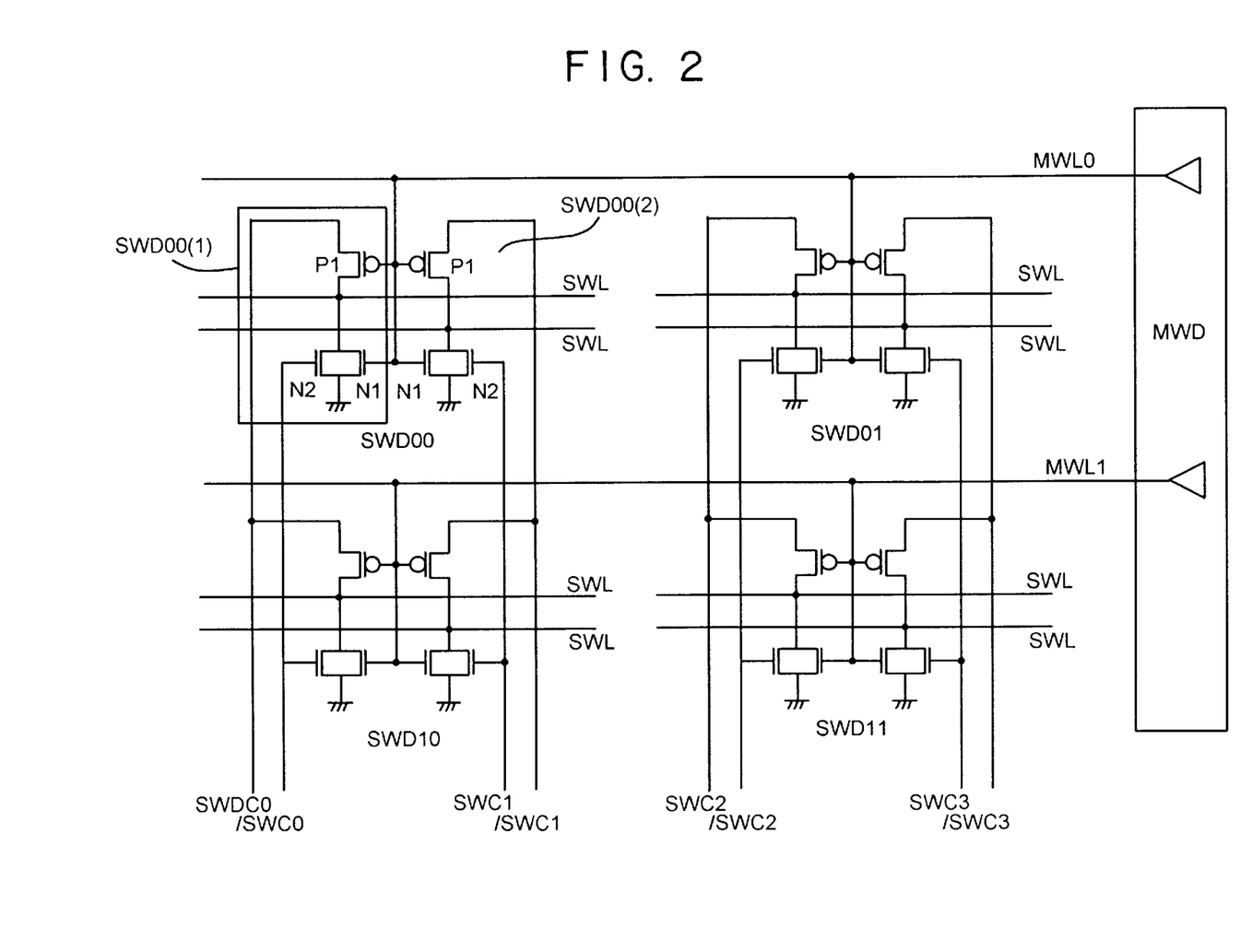
FIG. 2 is a diagram showing an example of a sub word decoder circuit.

FIG. 2 is a diagram illustrating an example of a sub word decoder circuit. In the diagram, four sub word decoder circuits SWD 00–11 are depicted. As shown in the picture, the sub word decoder circuit SWD 00 comprises a pair of sub word decoders SWD 00(1), SWD 00(2), and each of these sub word decoders SWD 00(1), SWD 00(2), selects and drives a sub word line SWL. Each sub word decoder circuit comprises a P-type transistor P1, and N-type transistors N1, N2. The gates of the P-type transistor P1 and the N-type transistor N1 are connected respectively to the corresponding main word line MWL. Furthermore, a selection signal SWC is supplied to the source terminal of the P-type transistor P1, and a further selection signal /SWC is supplied to the gate of the N-type transistor N2. Therefore, when the main word line MWL is at level L and the pair of selection signals SWC, /SWC are at levels H and L, the sub word decoder SWD 00(1) or SWD 00(2) drives the connected sub word line SWL to level H. Furthermore, if the main word line MWL is at level L, but the pair of selection signals SWC, /SWC are at levels L and H, then the sub word line SWL remains at level L.

Figure 3:
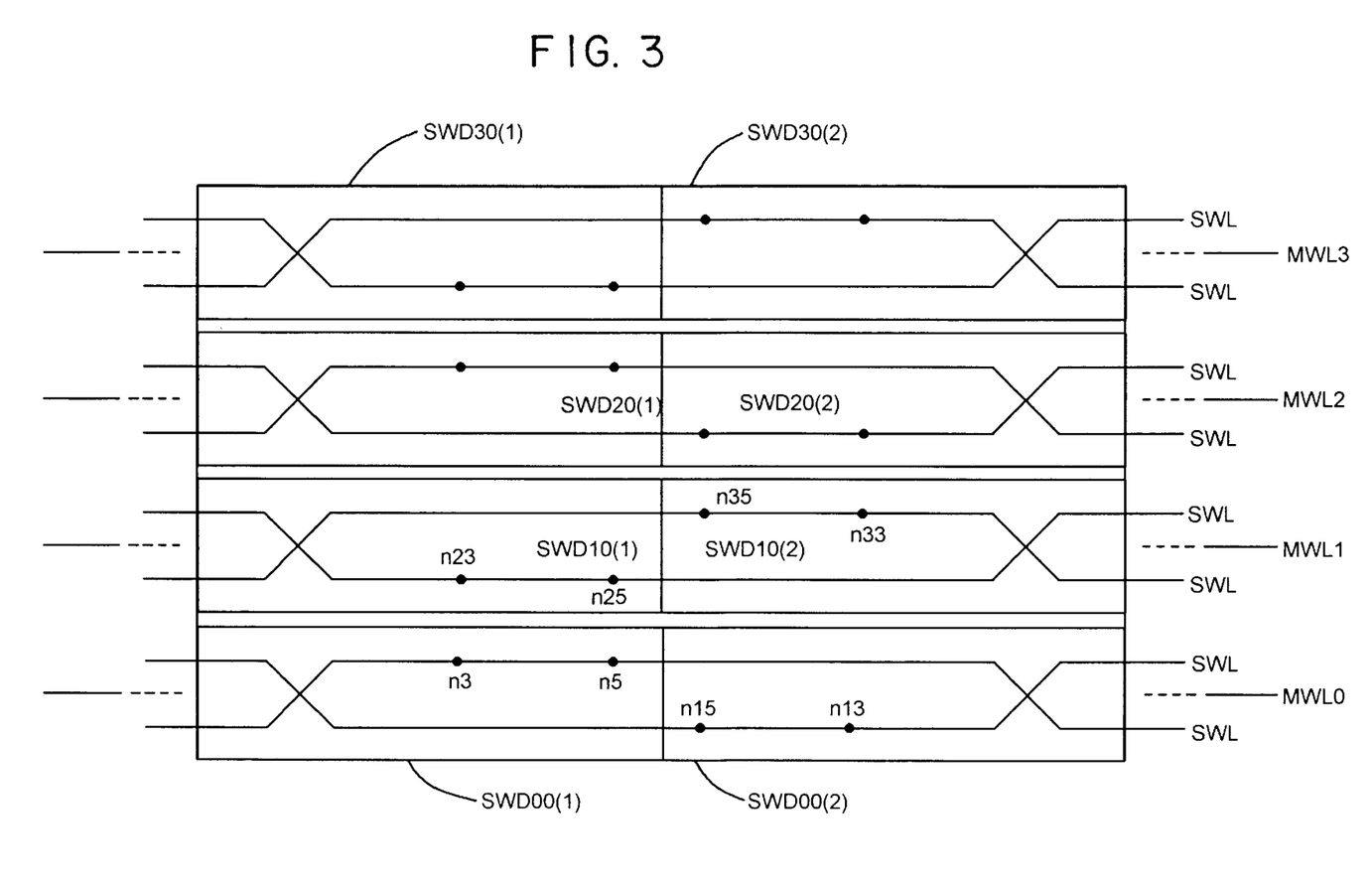
FIG. 3 is an approximate layout diagram of four pairs of sub word decoder circuits SWD 00–30 in this embodiment.

FIG. 3 is an approximate layout diagram of four pairs of sub word decoder circuits SWD 00–30. Each of the sub word decoder circuits SWD comprises a left and right pair of sub word decoders SWD 00(1), SWD 00(2), and in one of the sub word decoders SWD 00(1), the transistors N1 and P1 are connected to the sub word line SWL at nodes n3, n5, whilst in the other sub word decoder SWD 00(2), the transistors N1 and P1 are connected to the sub word line SWL at nodes n13, n15. The main word line MWL0 passes over the pair of sub word decoders SWD 00(1), SWD 00(2). The portions of the main word lines MWL passing over the sub word decoders are not depicted in FIG. 3.

Figure 4:
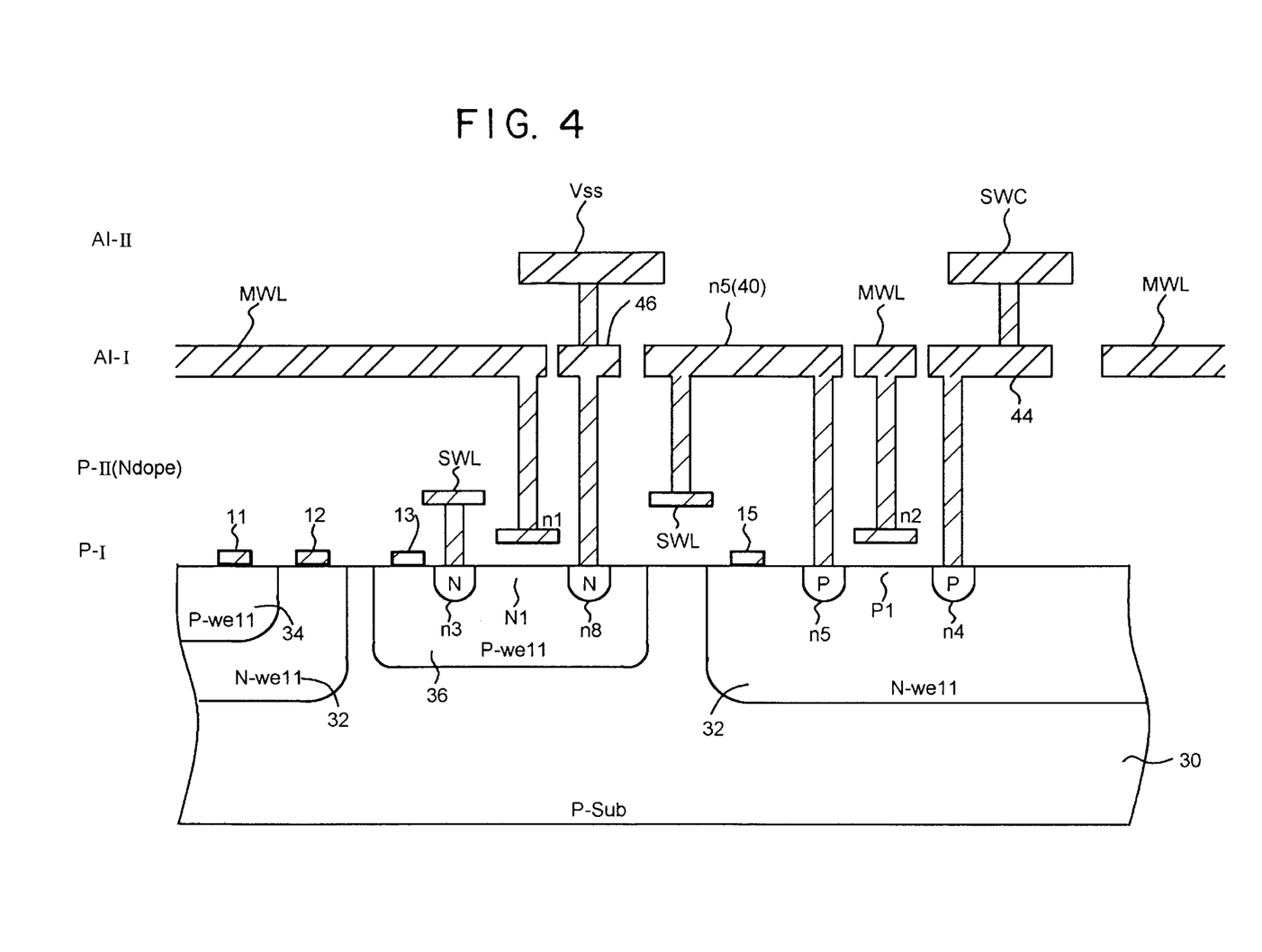
FIG. 4 is a partial sectional view of a sub word decoder circuit in this embodiment.
Figure 5:
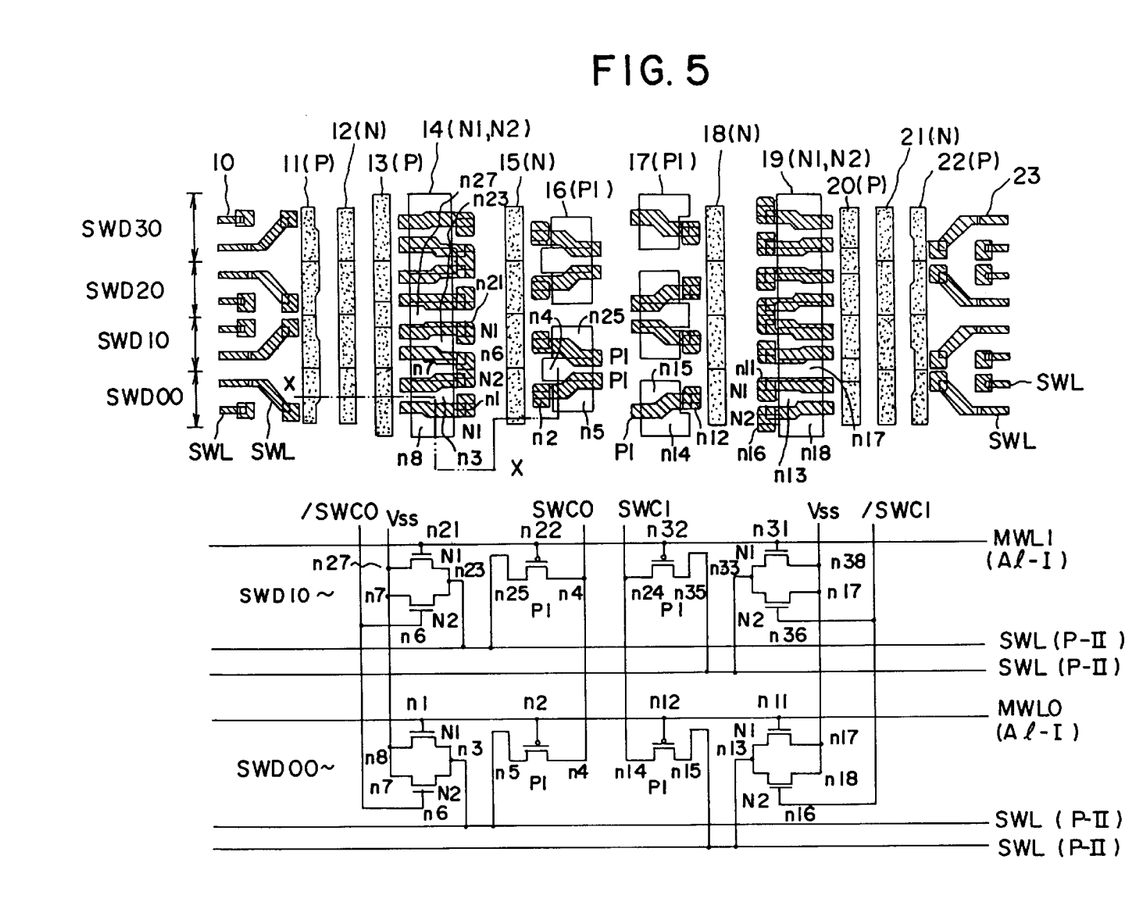
FIG. 5 is a diagram showing an example of a pattern for a first polysilicon conducting layer in this sub word decoder circuit.
Figure 6:
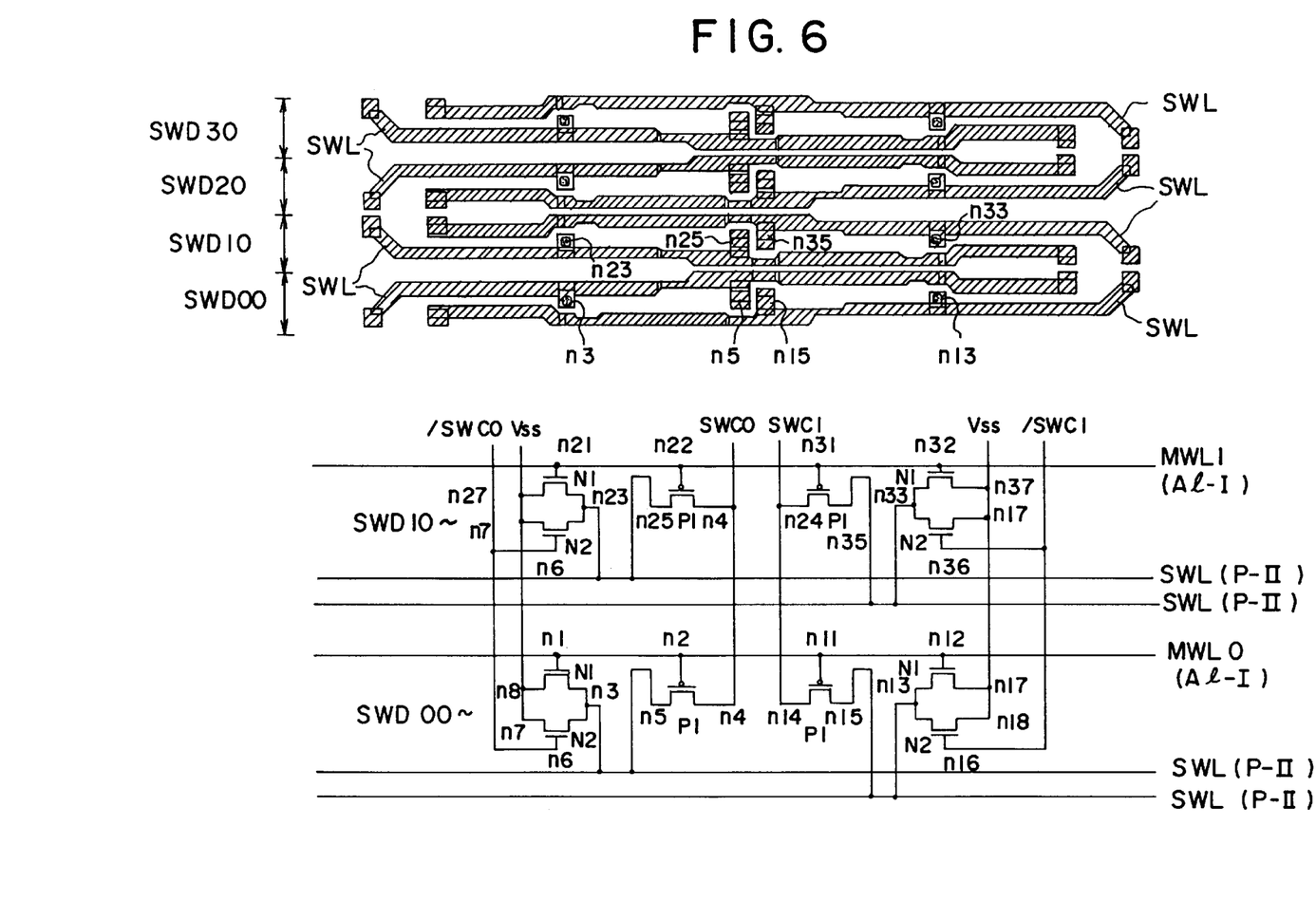
FIG. 6 is a diagram showing an example of a pattern for a second polysilicon conducting layer in this sub word decoder circuit.
Figure 7:
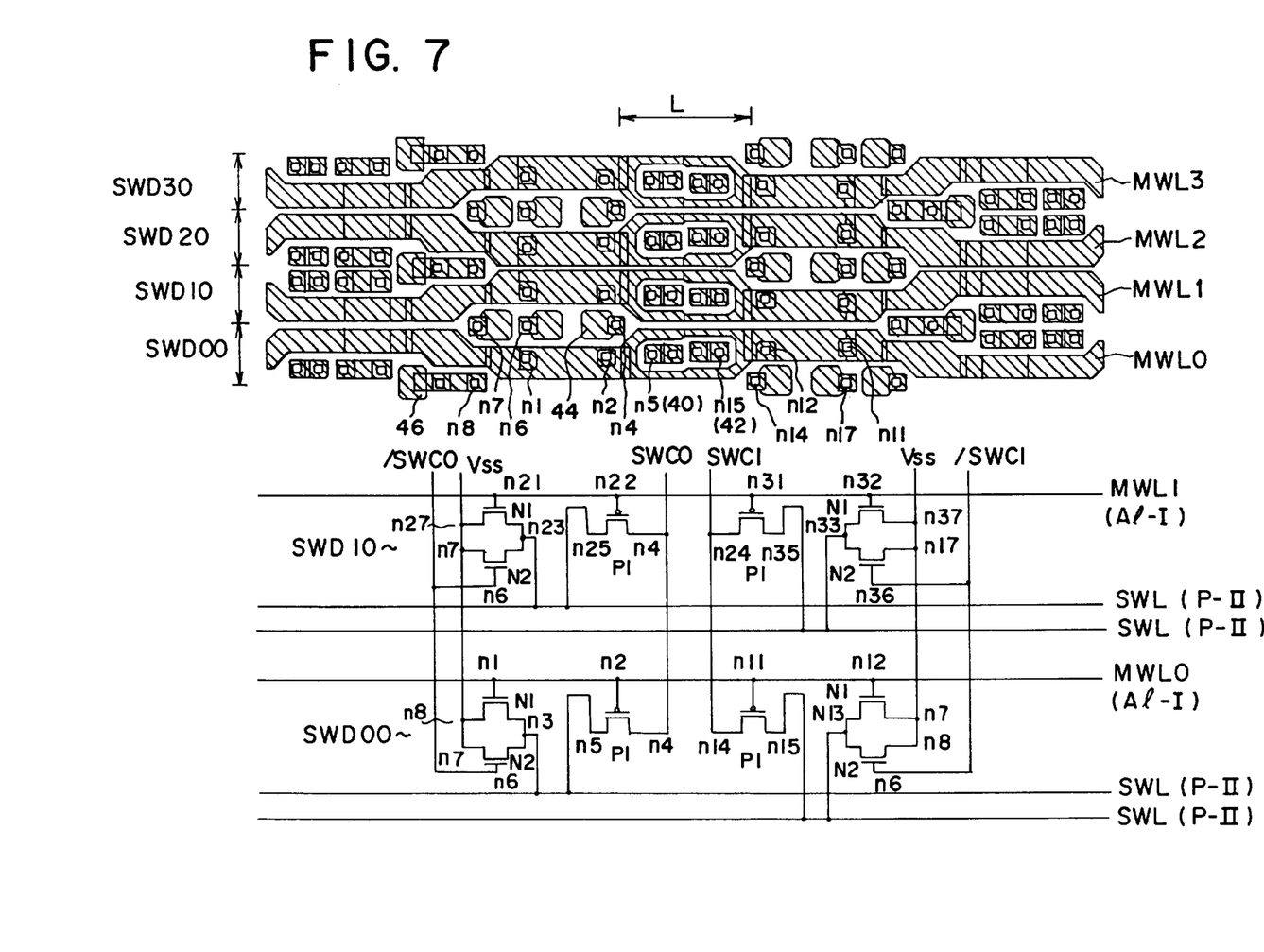
FIG. 7 is a diagram showing an example of a pattern for a first metal conducting layer in this sub word decoder circuit.

FIG. 4 is a partial sectional view of a sub word decoder circuit according to the present embodiment. Furthermore, FIG. 5 is a diagram illustrating an example of a pattern for the first polysilicon conducting layer in this sub word decoder circuit. FIG. 6 is a diagram illustrating an example of a pattern for the second polysilicon conducting layer in this sub word decoder circuit. FIG. 7 is a diagram illustrating an example of a pattern for the first metal conducting layer in this sub word decoder circuit. FIGS. 5–7 illustrate the correspondences between the various nodes of the respective pattern examples and the transistors in the sub word decoder circuits. Below, the specific composition of this sub word decoder circuit is described with reference to the drawings.

The pattern examples in FIG. 5, FIG. 6 and FIG. 7 comprise four groups of sub word decoder circuits SWD 00–SWD 30, as shown in FIG. 3. In each of the diagrams, the specific sub word decoder circuit is labelled supplementarily, and the correspondence between the nodes of the respective transistors is a described. Here, only two groups of sub word decoder circuits SWD 00, SWD 10 are labelled.

In the pattern diagram for the first polysilicon conducting layer shown in FIG. 5, numerals 10 and 23 are connecting terminals which are connected to the sub word lines on either side. In the memory cell areas on either side of the sub word decoder area, the sub word line is employed as gate electrodes for the selection transistors in the memory cells. As shown in FIG. 6, in the sub word decoder region, the sub word lines SWL are constituted by the second polysilicon conducting layer, which occupies a higher position than the first polysilicon conducting layer. Therefore, in FIG. 6, 8 sub word lines SWL are arranged from left to right. The sub word line SWL constituted by the second polysilicon conducting layer P-II is connected at both ends thereof to the first polysilicon conducting layer P-I.

The contact electrodes 11, 12, 13 and 22, 21, 20 in FIG. 5 are, respectively, P well contact electrodes, N well contact electrodes and P well contact electrodes. The sectional view in FIG. 4 is a cross-section along line X—X in FIG. 5; an N well region 32 and a P well region 36 are formed in the P-type substrate 30, and furthermore, a P well region 34 wherein a memory cell transistor (omitted from diagram) is fabricated, is formed inside the N well region 32.

In FIG. 5, N channel transistors N1, N2 are formed respectively in regions 14 and 19. The left-hand N transistor region 14 and the right-hand N transistor region 19 have a different order of arrangement of the transistors N1 and N2. In the N transistor region 14, transistors are formed in the order N1, N2, N2, N1, . . . from the bottom upwards. In the N channel transistor region 19, on the other hand, transistors are formed in the order N2, N1, N1, N2, . . . from the bottom upwards. In the N channel transistor region 14, the transistors N2 in adjoining sub word decoders SWD 00, SWD 10 have a common source region n7, and their gate electrodes n6 are connected. As illustrated in FIG. 4 and FIG. 6, the drain regions n3 of transistors N1, N2 are connected directly to the second polysilicon conducting layer P-II (SWL). Since this polysilicon conducting layer P-II is doped with an N-type impurity, it is possible to make direct contact with the N-type drain region n3. Moreover, as illustrated in FIG. 4 and FIG. 7, the source region n8 of transistor N1 is connected to the first metal conducting layer Al-I, and it is also connected to the ground power supply Vss composed of the second metal conducting layer Al-II positioned thereabove. Similarly to the source region n8 of transistor N1, the source region n7 of transistor N2 is connected to the first metal conducting layer Al-I, and it is also connected to the ground power supply Vss composed of the second metal conducting layer Al-II positioned thereabove (FIG. 7).

P channel transistor regions 16, 17 are provided adjacently to the N well contact electrodes 15, 18 for the N well region 32. In P channel transistor region 16, the P channel transistor P1 in the sub word decoder circuit SWD 00 and the P channel transistor P1 in the sub word decoder circuit SWD 10 have a shared source region n4. As illustrated in FIG. 4 and FIG. 7, this source region n4 is connected to the first metal conducting layer Al-I , and it is also connected to a selection signal SWC constituted by the second metal conducting layer Al-II positioned thereabove. Moreover, as shown in FIG. 4 and FIG. 7, the gate electrode n2 of the P channel transistor P1 is connected directly to a main word line MWL. The most characteristic feature of this composition is that, as shown in FIGS. 4, 6 and 7, the P-type drain region n5 of the P channel transistor P1 is connected directly to the island-shaped pattern 40 constituted by the first metal conducting layer Al-I, and moreover, this island-shaped pattern 40 is connected to a sub word line SWL constituted by the second polysilicon conducting layer P-II. Since the second polysilicon conducting layer P-II is doped with N-type impurity, direct contact cannot be made to the P-type drain region n5. Therefore, a connection is first made to the first metal conducting layer Al-I and then to the second polysilicon conducting layer P-II. Consequently, it is necessary to provide the island-shaped pattern 40 within the first metal conducting layer Al-I.

As shown in FIG. 7, the presence of the aforementioned island-shaped pattern 40 places a restriction on the pattern shape of the main word lines MWL in the first metal conducting layer Al-I. Moreover, as the example in FIG. 7 reveals, the island-shaped patterns 44, 46 in the first metal conducting layer Al-I, which are used when connecting from the lower layer to the upper second metal conducting layer Al-II (see FIGS. 4 and 7), also place a restriction on the pattern shape of the main word lines MWL in the first metal conducting layer Al-I.

As can be seen from the pattern of the first metal conducting layer Al-I in FIG. 7, the pitch of the main word lines MWL in the vertical direction (column direction) is determined by the pitch of the memory cells. Therefore, since the sub word decoder circuits SWD are formed within this pitch in the column direction, they have an elongated shape in the row direction (horizontal direction in FIG. 7), as shown in the drawings. Due to the hierarchical structure of the word lines, desirably, the main word line MWL is formed as widely as possible using the first metal conducting layer Al-I. Therefore, the corresponding pattern width is formed as broadly as possible. As a result, the main word line MWL takes up most of the surface area in the region where the sub word decoder circuit is formed.

However, in the sub word decoder circuit, it is necessary to provide several of the aforementioned island-shaped patterns in the first metal conducting layer Al-I. These island-shaped patterns 40, 42, 44, 46, and so on, place restrictions on the pattern shape of the main word line MWL, which has a thick line width as described above. Therefore, the linearity of the pattern shape of the main word line MWL may also be impaired.

As shown in FIG. 7, in order to form the island patterns 40, 42, the shape of the main word line MWL is designed such that it branches temporarily and splits into a plurality of lines, in a row direction, and then reconverges. In the region where it splits, the aforementioned island-shaped patterns 40, 42 are formed within the main word line MWL, and are electrically different therefrom. In other words, the island-shaped patterns 40, 42 have a relationship with respect to the shape of the main word lines MWL similar to that of islands in the middle of a river. By adopting this shape, it is possible to maintain the overall line width at or above a prescribed value. Therefore, it is possible to prevent the increase in resistance generated if a severely contorted shape is adopted in order to avoid the island-shaped patterns 40, 42.

Figure 8:
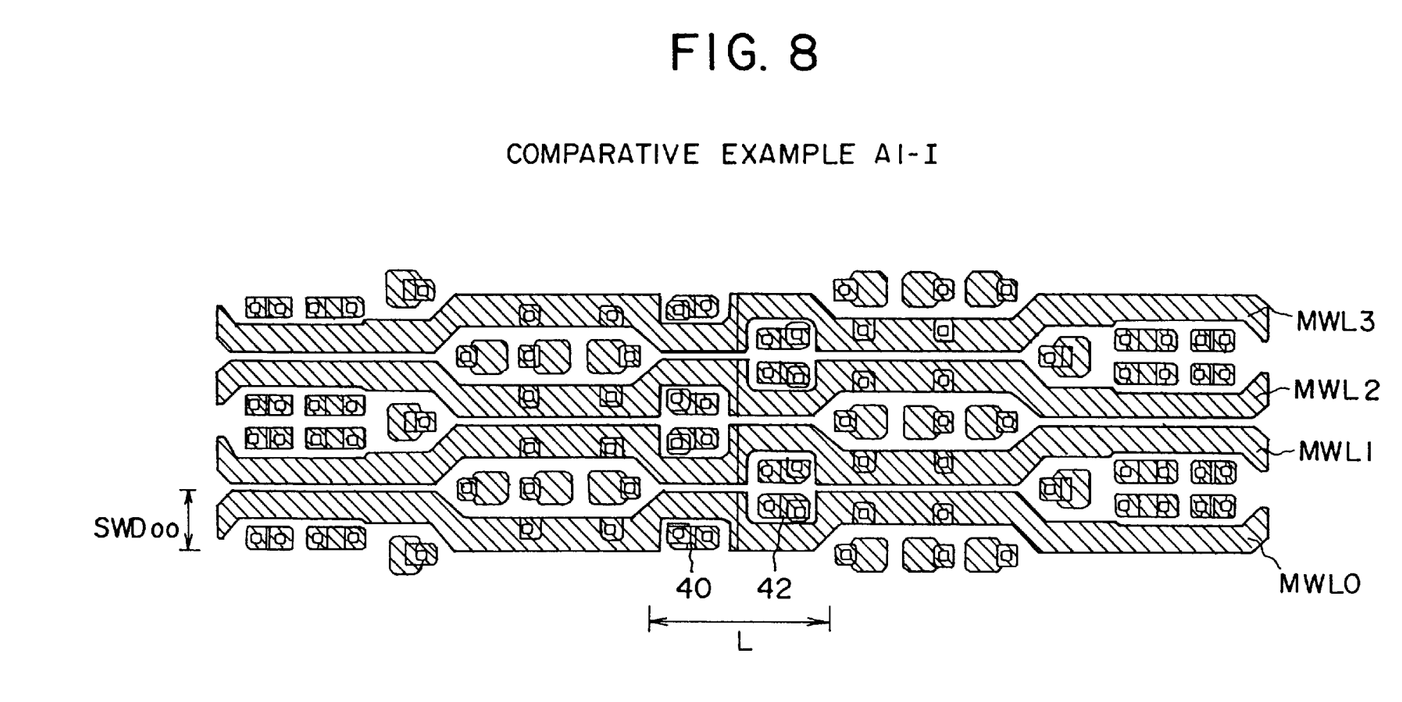
FIG. 8 is a comparative example for illustrating the merits of the embodiment of the invention.

FIG. 8 is a comparative example for showing the merits of the present embodiment. FIG. 8 shows the pattern of a first metal conducting layer Al-I in a comparative example. In this illustration, the main word line MWL has a contorted shape, in order to avoid the island-shaped regions 40, 42. Therefore, the linearity of the main word line MWL is impaired, and furthermore, the line width becomes very narrow in the regions where the line curves, thereby leading to increased resistance and the occurrence of electromigration.

Returning to FIG. 7, the other island-shaped patterns 44, 46 are patterns which are shared between adjoining sub word decoder circuits. Therefore, these island-shaped patterns are formed on the boundary lines of the sub word decoder regions (SWD 00, SED 10) so it is not necessary to adopt a very acutely angled shape for the curved portions of the main word line MWL in order to avoid the island-shaped patterns 44, 46. On the other hand, the island-shaped patterns 40, 42 are intrinsic nodes within the sub word decoder circuit SWD 00, and they must be provided within the respective sub word decoder regions. Therefore, in the present embodiment, each main word line MWL is given a shape whereby it branches and splits temporarily in a position corresponding to the island-shaped patterns and then reconverges, such that the main word line MWL can coexist with the island-shaped patterns. The distance L in the comparative example in FIG. 8 must be a sufficient distance to enable the main word line MWL to curve. However, in FIG. 7, it can be seen that by adopting a shape whereby the main word line MWL temporarily branches and splits, the corresponding distance L can be shortened to a greater extent than in the comparative example. As a result, it is possible to shorten the length required in the row direction for the sub word decoder circuit, and the surface area occupied by a plurality of sub word decoder circuits formed in a memory cell area MCA can also be reduced. These merits contribute significantly to enhanced memory capacity.

In the foregoing embodiment, in the sub word decoder regions, the pattern shape of the main word line is designed such that it branches and splits temporarily and then reconverges. Similarly, in cases where it is necessary to provide electrically different island-shaped patterns in a portion of the metal conducting layer constituting the main word lines, in a region other than the sub word decoder regions, it is also possible to prevent increases in resistance and the occurrence of electromigration for the main word lines, without impairing the linearity of the main word lines, by adopting a similar shape.

As described above, according to the present invention, in a memory comprising word lines in a hierarchical structure, since the pattern shape of the conducting layer constituting the main word lines is designed such that it branches and splits temporarily and then reconverges, electrically different island-shaped patterns being provided within said main word lines, it is possible to avoid increases in resistance and the occurrence of electromigration, without impairing the linearity of the main word lines.

What is claimed is:

1. A semiconductor memory device having a plurality of memory cells and a plurality of conducting layers formed on a semiconductor substrate, comprising:

a plurality of main word lines composed of a first conducting layer formed on said semiconductor substrate and arranged in a row direction in the region of said memory cells;

a plurality of sub word lines composed of a second conducting layer positioned below said first conducting layer formed on said semiconductor substrate; and sub word decoder circuits for driving said sub word lines, positioned along the path of said main word lines;

wherein, in the region in which said sub word decoder circuits are formed, the pattern of said main word lines has a shape whereby said pattern temporarily branches and splits into a plurality of lines and then reconverges, along said row direction, island-shaped patterns which are electrically different from said main word lines being formed within said split region by means of said first conducting layer.

2. The semiconductor memory device according to claim 1, wherein said sub word decoder circuits comprise a P-type transistor and an N-type transistor, the source or drain regions of said transistors being connected to said island-shaped patterns formed by said first conducting layer, and said island-shaped patterns being connected to said sub word lines formed by said second conducting layer.

3. The semiconductor memory device according to claim 2, wherein said main word lines and said sub word lines are arranged in said row direction in the region in which said sub word decoder circuits are formed.

4. The semiconductor memory device according to claim 2, wherein said second conducting layer is constituted by a polysilicon layer doped with an N-type impurity, said first conducting layer is constituted by a metal conducting layer, and the island-shaped patterns formed by said first conducting layer are connected to the source or drain regions of said P-type transistors.

5. A semiconductor memory device having a plurality of memory cells and a plurality of conducting layers formed on a semiconductor substrate, comprising:

a plurality of main word lines composed of a first conducting layer formed on said semiconductor substrate and arranged in a row direction in the region of said memory cells;

a plurality of sub word lines composed of a second conducting layer positioned below said first conducting layer formed on said semiconductor substrate; and sub word decoder circuits for driving said sub word lines, positioned along the path of said main word lines;

wherein the pattern of said main word lines has a shape whereby said pattern temporarily branches and splits into a plurality of lines and then reconverges, along said row direction, island-shaped patterns which are electrically different from said main word lines being formed within said split region by means of said first conducting layer.

6. A semiconductor memory device having a plurality of memory cells and a plurality of conducting layers formed on a semiconductor substrate, comprising:

a plurality of word lines composed of a conducting layer formed on said semiconductor substrate and arranged in a prescribed direction within the region of said memory cells, wherein the pattern of said word lines has a shape whereby said pattern branches temporarily and splits into a plurality of lines and then reconverges, along said prescribed direction, island-shaped patterns, which are electrically different from said word lines, being formed within said separated regions by means of said conducting layers.

* * * * *